(12) United States Patent
Barry

(10) Patent No.: US 11,257,726 B2
(45) Date of Patent: Feb. 22, 2022

(54) LOW PROFILE INTEGRATED CIRCUIT

(71) Applicant: Global Circuit Innovations Inc., Colorado Springs, CO (US)

(72) Inventor: Timothy Mark Barry, Colorado Springs, CO (US)

(73) Assignee: Global Circuit Innovations Incorporated, Colorado Springs, CO (US)

(*) Notice: Subject to any disclaimer, the term of this patent is extended or adjusted under 35 U.S.C. 154(b) by 0 days.

(21) Appl. No.: 16/918,565

(22) Filed: Jul. 1, 2020

(65) Prior Publication Data

US 2022/0005741 A1   Jan. 6, 2022

(51) Int. Cl.
| | |
|---|---|
| *H01L 23/055* | (2006.01) |
| *H01L 23/00* | (2006.01) |
| *H01L 21/48* | (2006.01) |
| *H01L 23/66* | (2006.01) |
| *H01L 23/498* | (2006.01) |
| *H01L 23/522* | (2006.01) |

(52) U.S. Cl.
CPC ........ *H01L 23/055* (2013.01); *H01L 21/4853* (2013.01); *H01L 23/49816* (2013.01); *H01L 23/5221* (2013.01); *H01L 23/66* (2013.01); *H01L 24/05* (2013.01); *H01L 24/13* (2013.01)

(58) Field of Classification Search
CPC ...................................................... H01L 23/055
See application file for complete search history.

(56) References Cited

U.S. PATENT DOCUMENTS

| | | | | |
|---|---|---|---|---|
| 5,107,328 A | * | 4/1992 | Kinsman | ............... H01L 23/057 257/690 |
| 8,837,159 B1 | * | 9/2014 | Buuck | ...................... H05K 3/30 361/761 |

* cited by examiner

*Primary Examiner* — William A Harriston
(74) *Attorney, Agent, or Firm* — Thomas J. Lavan

(57) ABSTRACT

A device is provided. The device may include one or more of a package base, a substrate, a die secured to the substrate, a plurality of bond connections, and a package lid. The package base includes a plurality of package leads and a package base body. The package base body includes an open cavity disposed through the entire package base body, a plurality of package bond pads, disposed within a periphery of the open cavity, and a mounting shelf, disposed within the open cavity. The substrate is secured to the mounting shelf, and includes a plurality of substrate bond pads. The plurality of bond connections are configured to provide electrical connections between one or more of the die, the substrate bond pads, and the package bond pads. The package lid is secured over the open cavity to the package base body.

17 Claims, 16 Drawing Sheets

Low-Profile Package Configuration

Substrate Bonded to Package Base With Bond Wires

Fig. 1A Dual In-Line Package Configuration
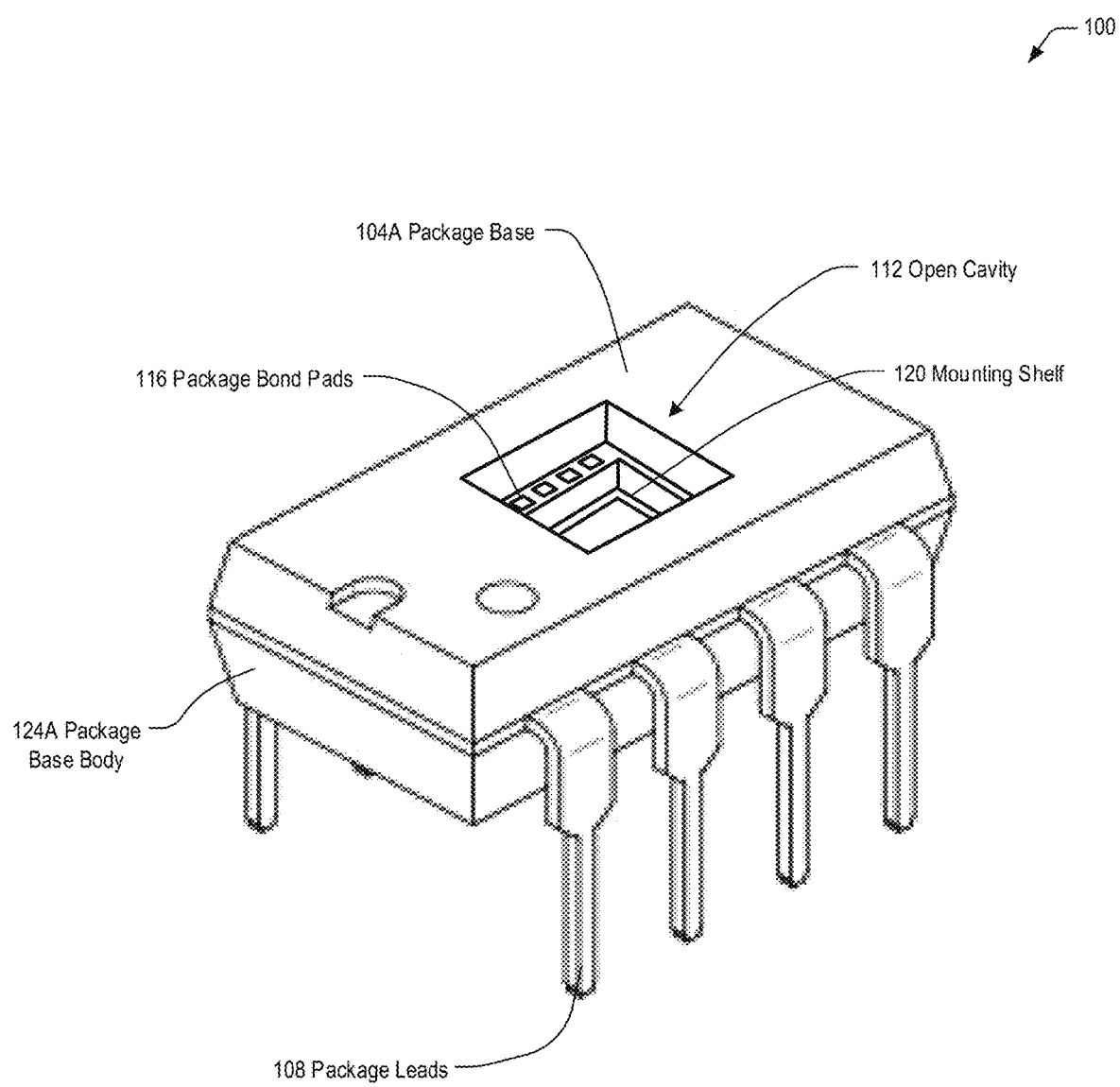

*Fig. 1B Dual In-Line Package Configuration*
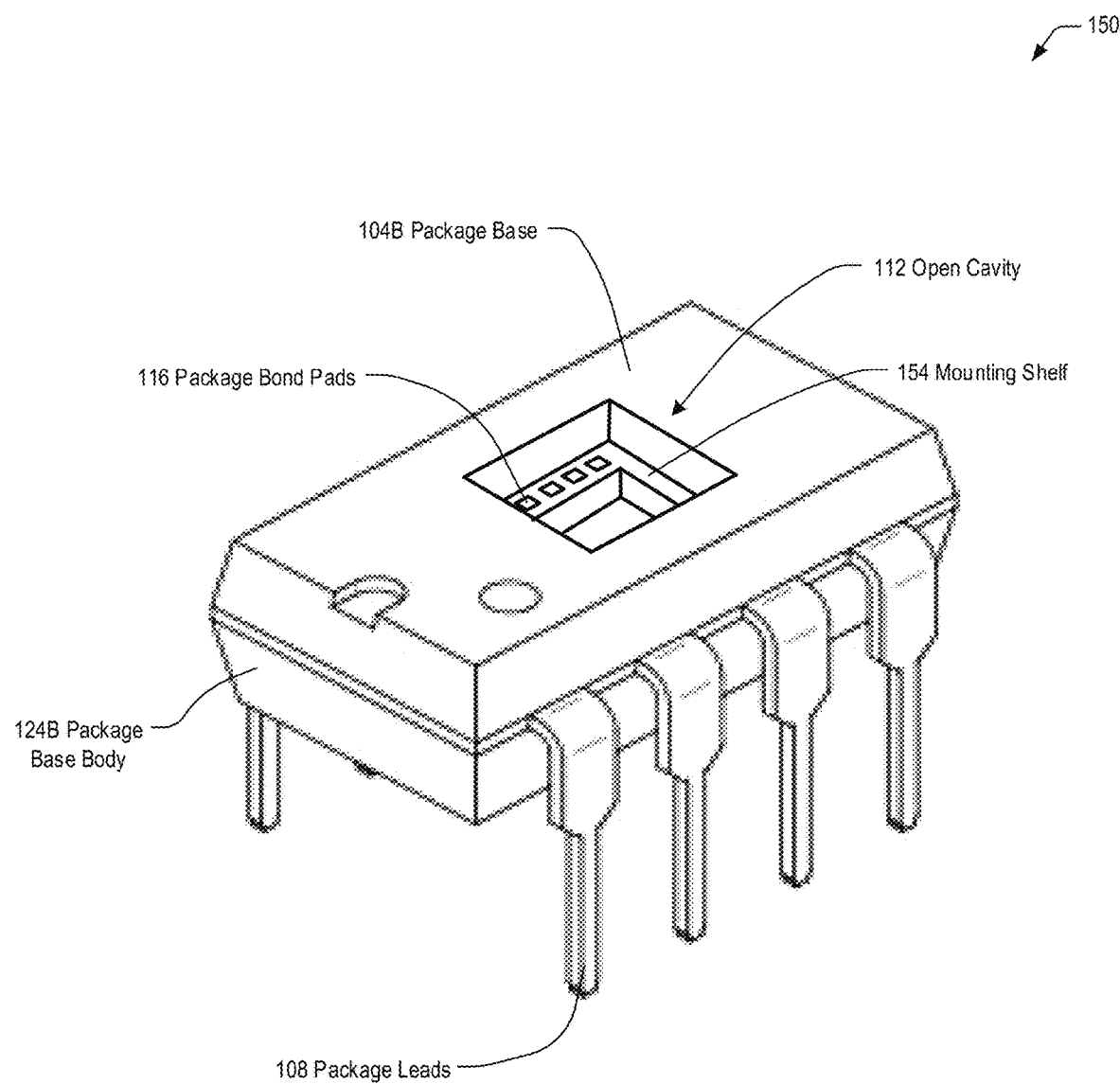

*Fig. 2A Pin Grid Array Package Configuration*
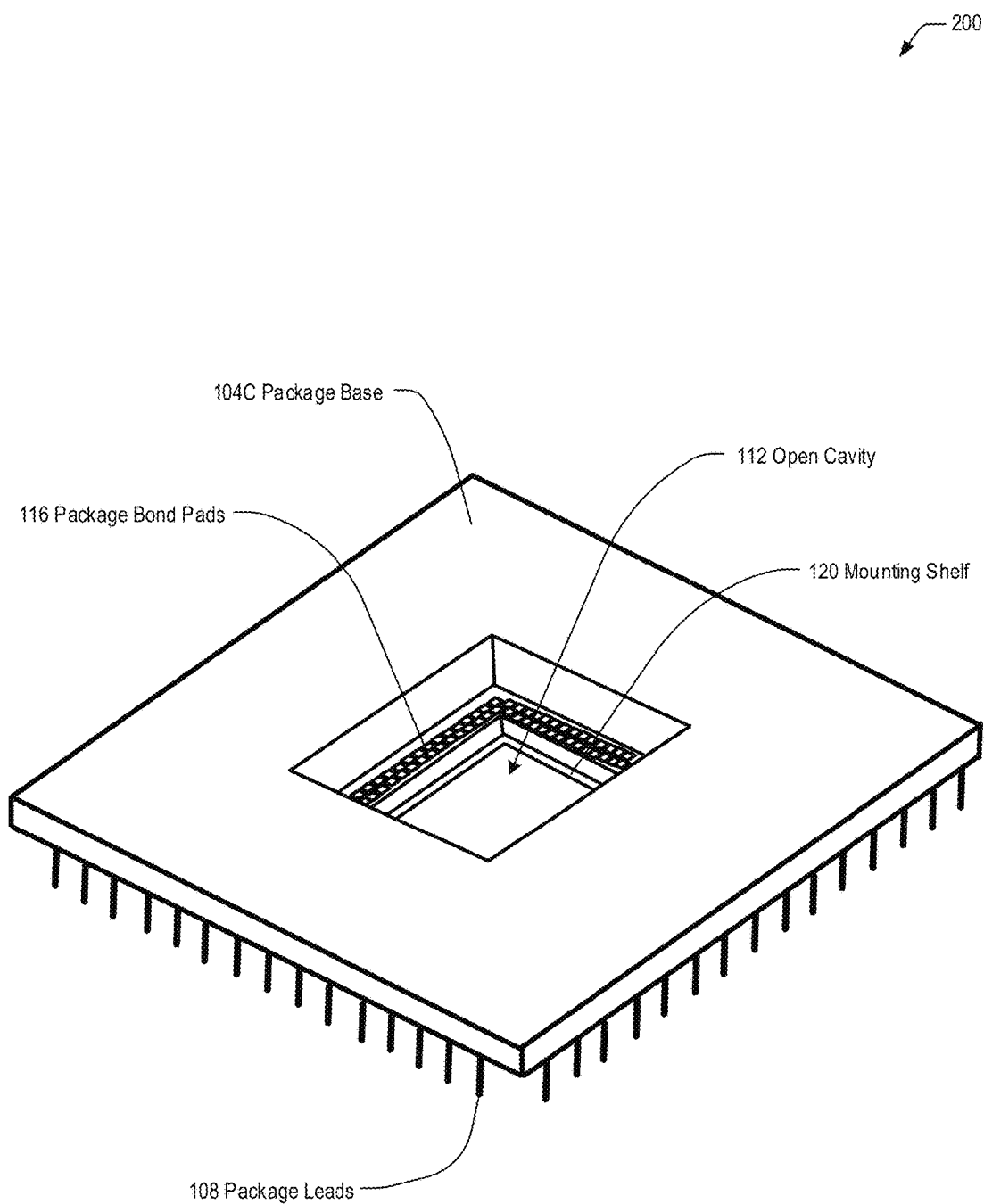

*Fig. 2B Pin Grid Array Package Configuration*
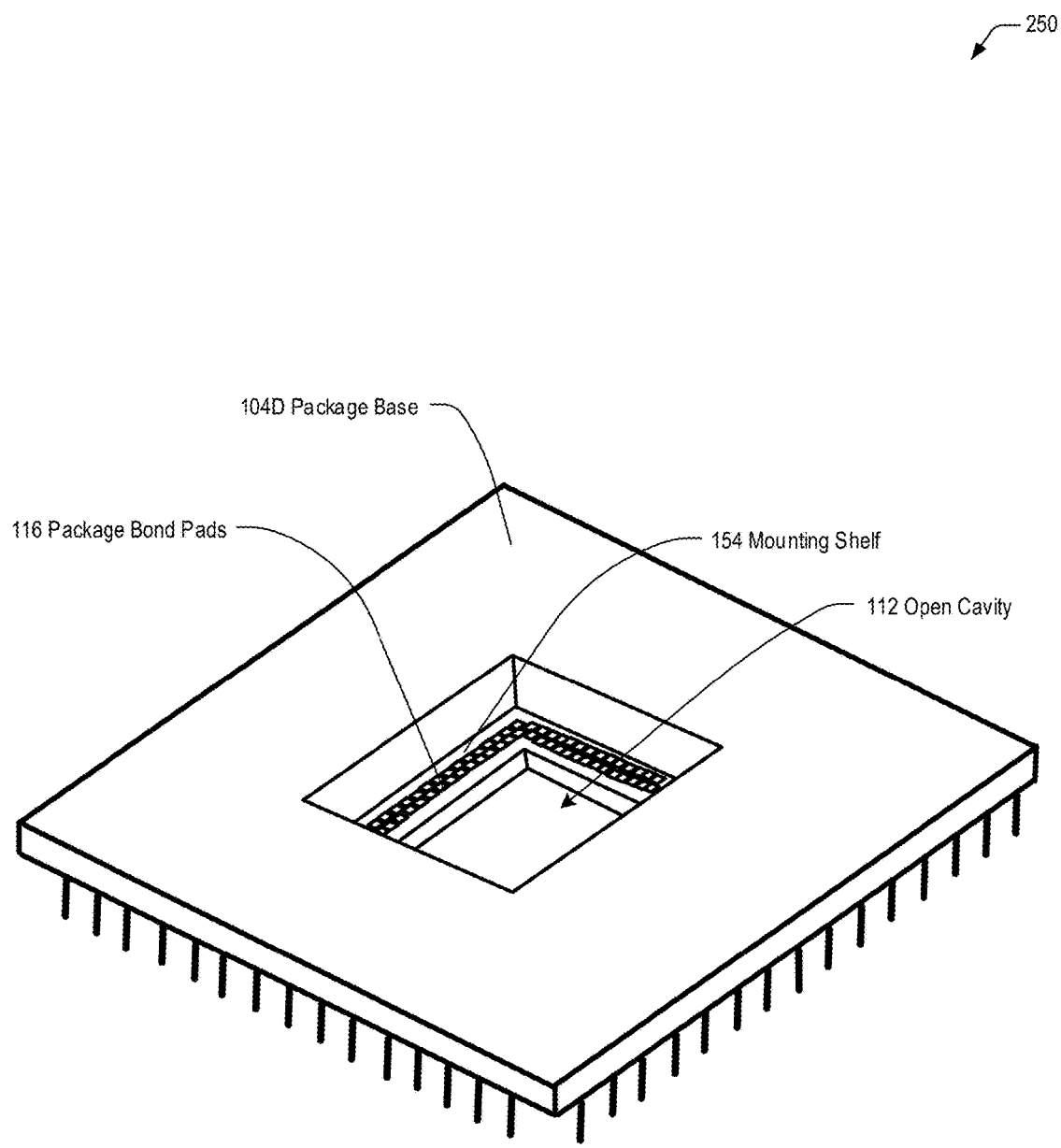

*Fig. 3A Quad Flat Pack Package Configuration*
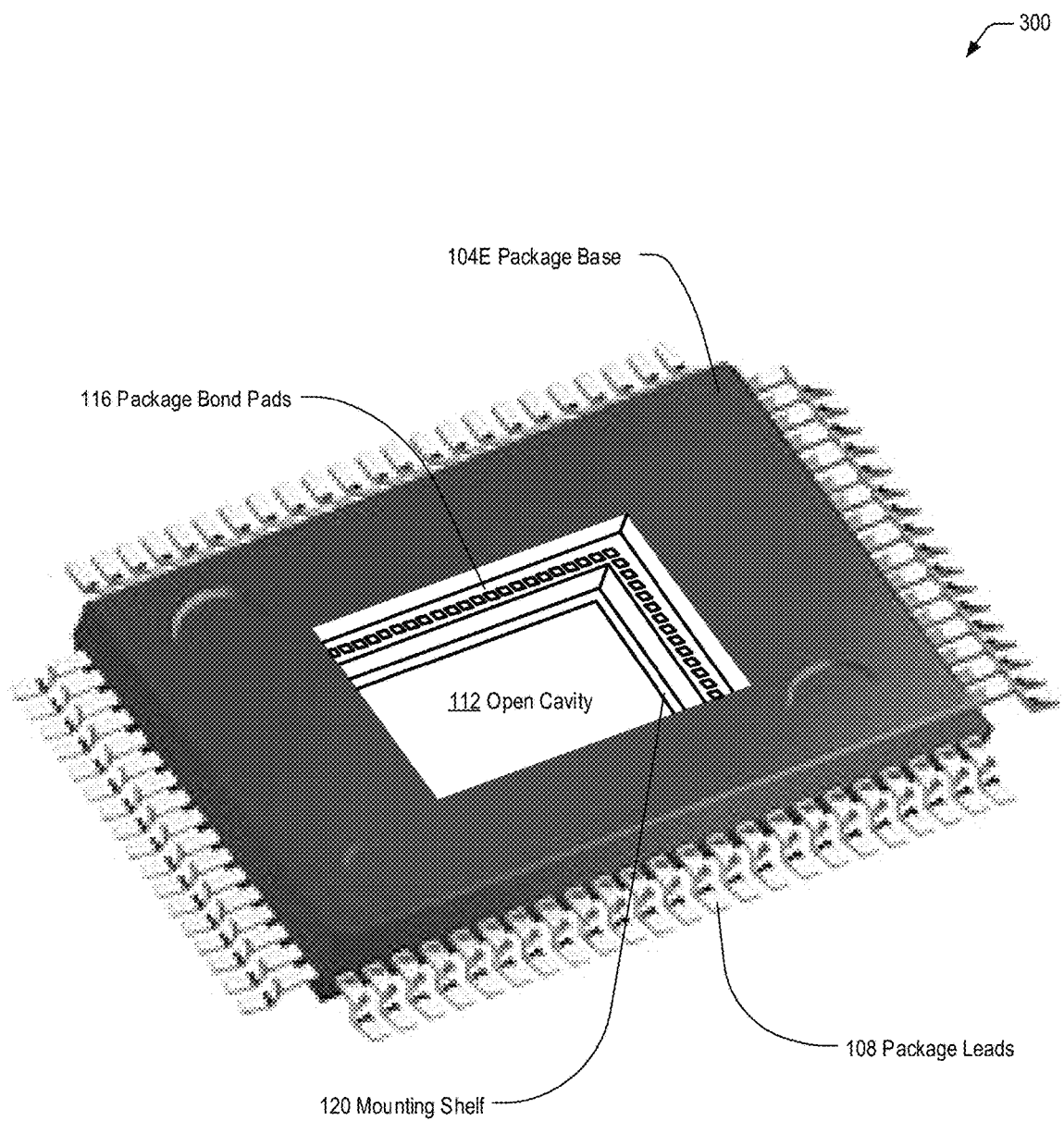

*Fig. 3B Quad Flat Pack Package Configuration*
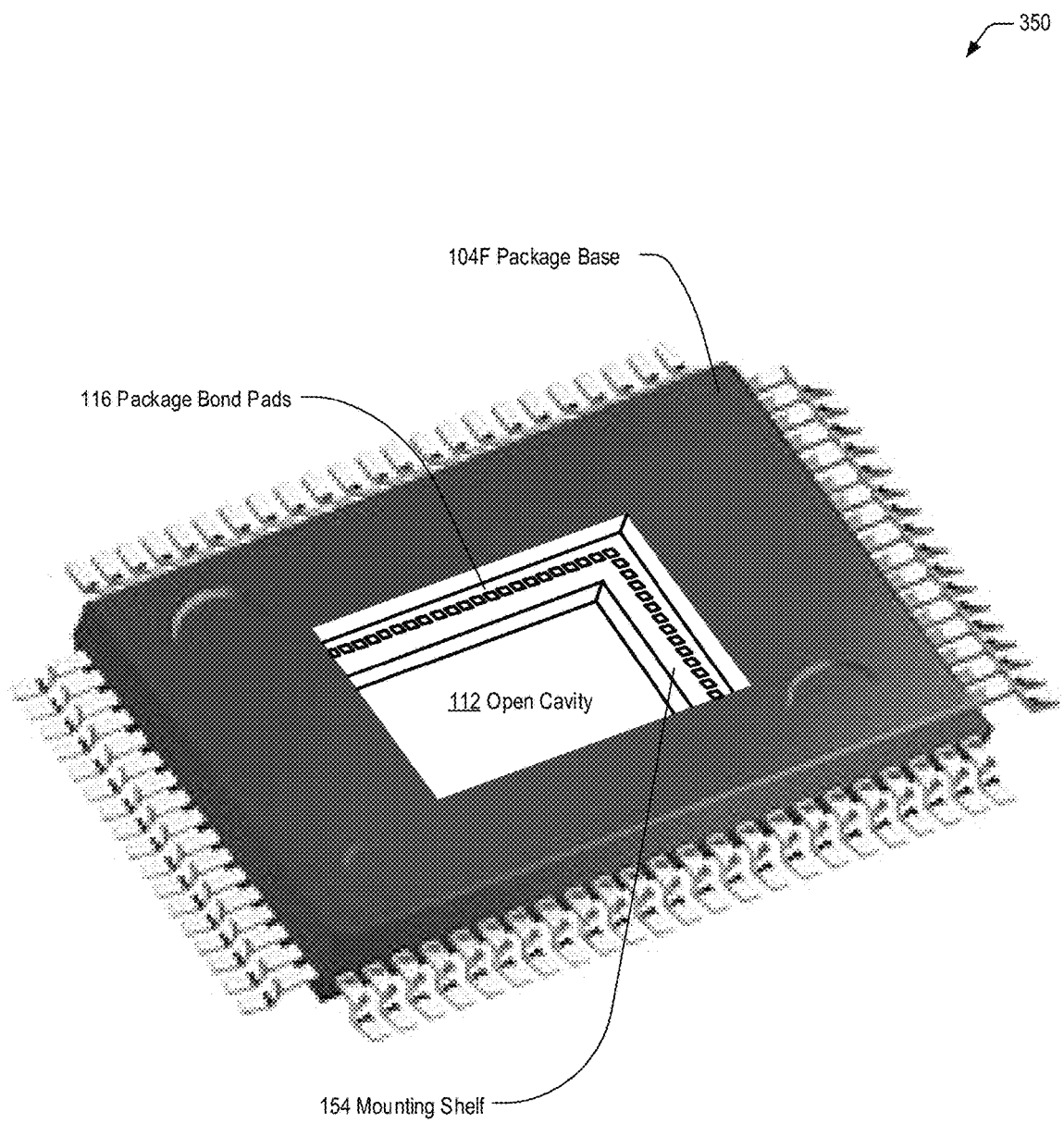

Fig. 4A Low-Profile Package Configuration
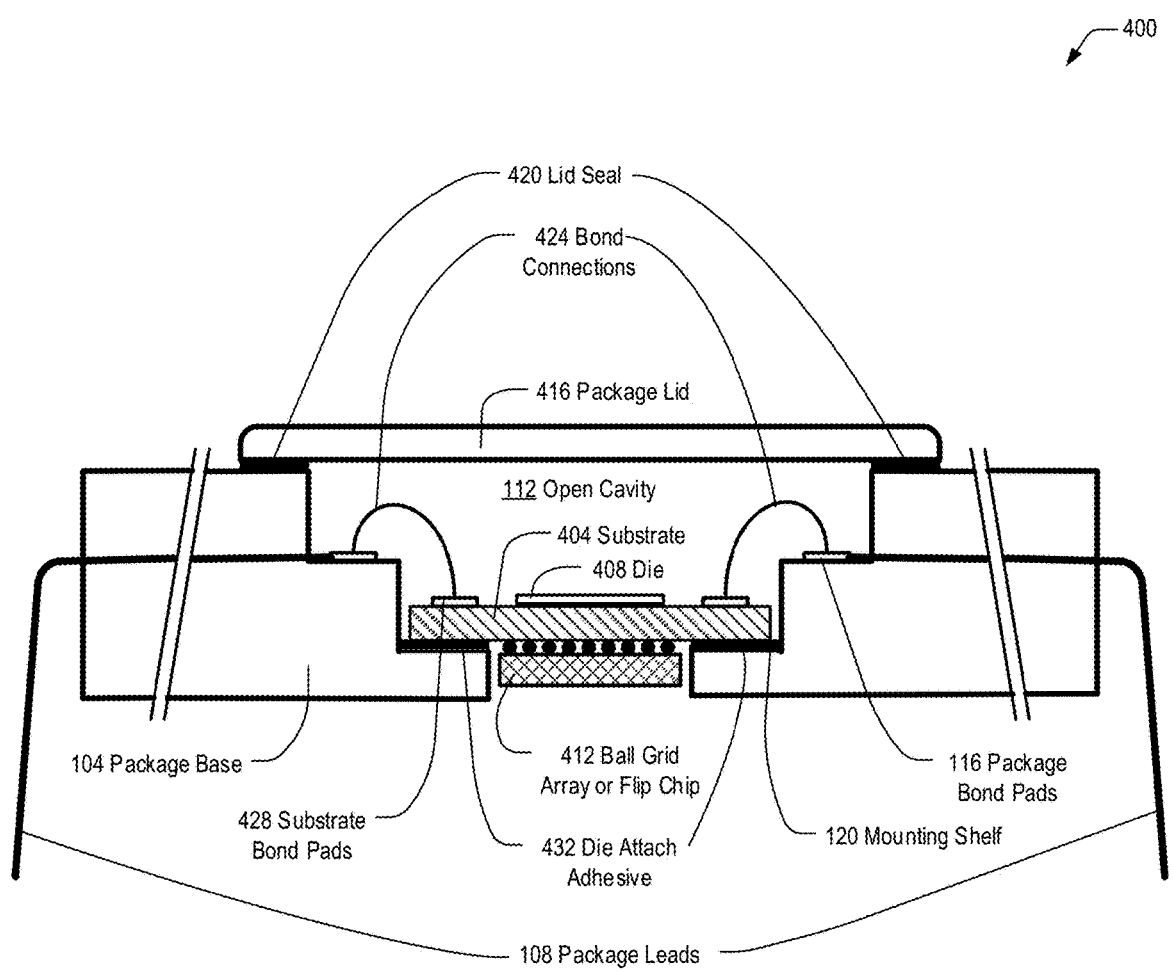

Fig. 4B Low-Profile Package Configuration
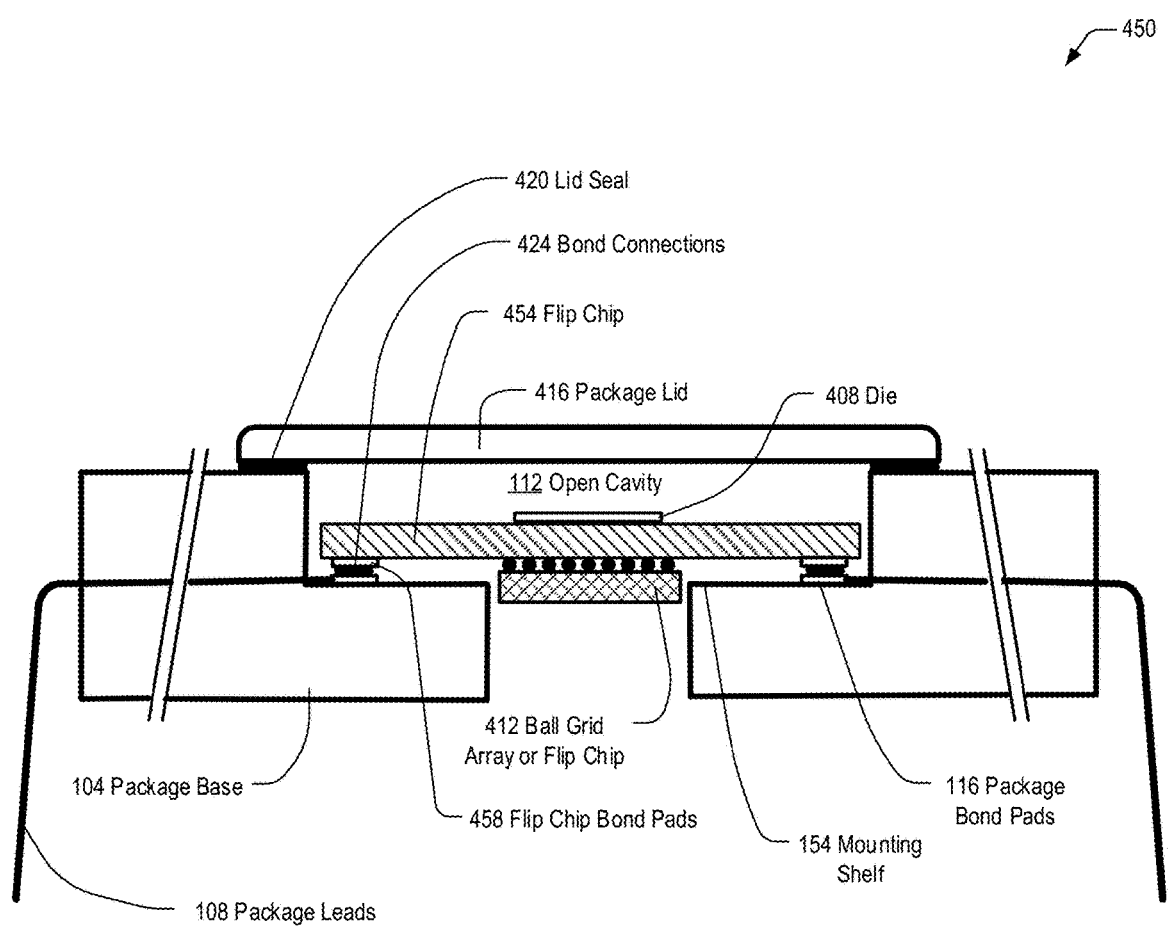

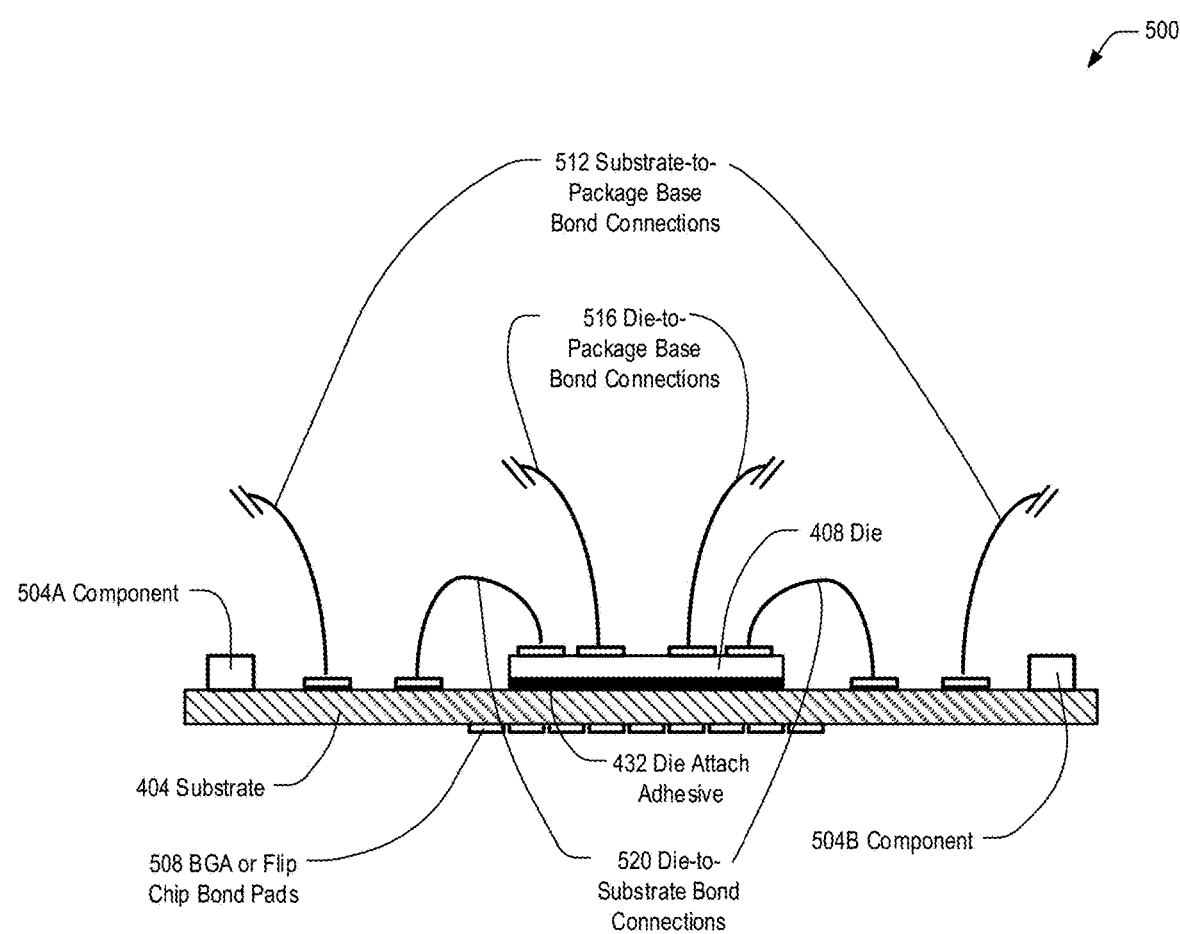
Fig. 5A Substrate and Die Detail

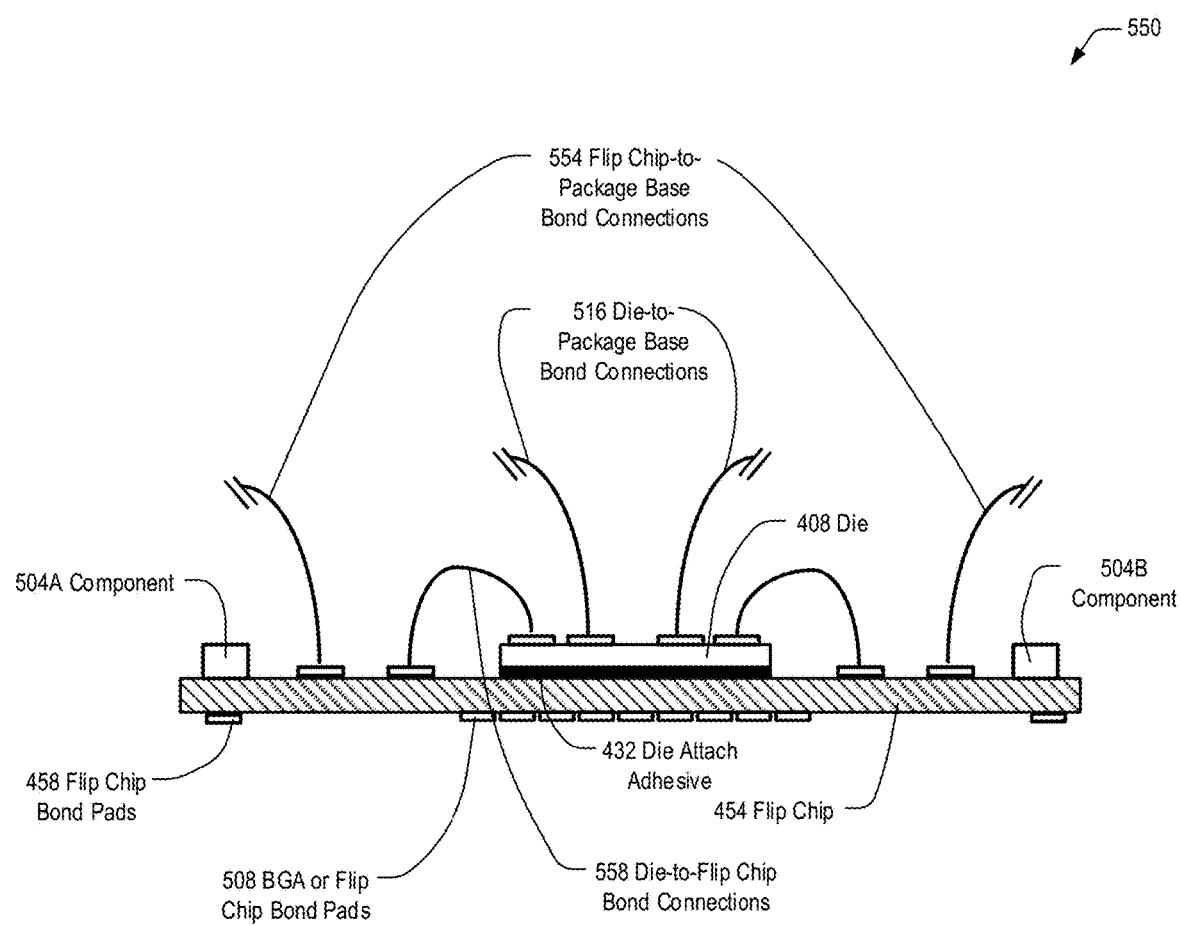
*Fig. 5B Flip Chip and Die Detail*

Fig. 6A  Substrate Bonded to Package Base With Bond Wires
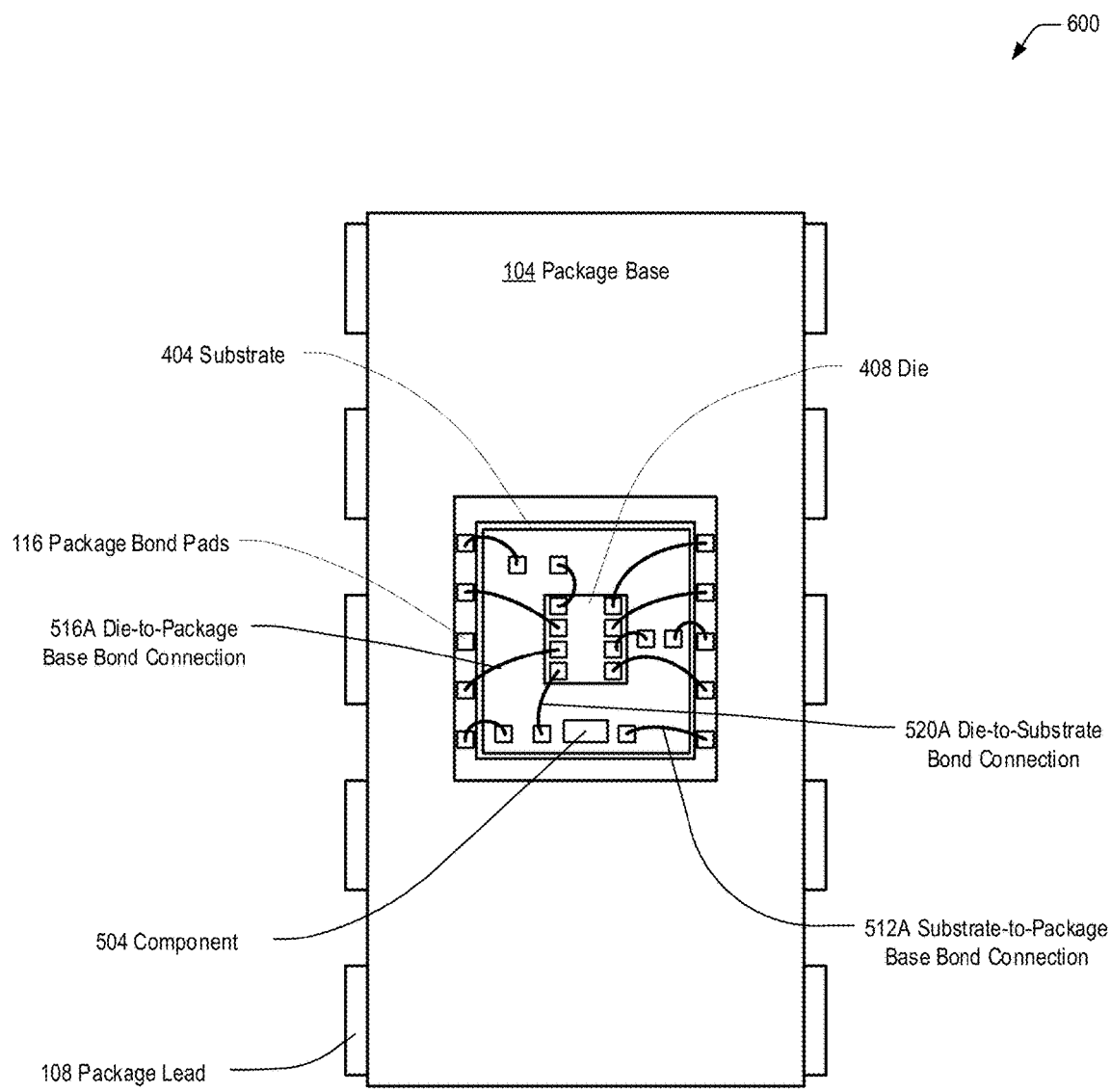

Fig. 6B  Substrate Bonded to Package Base With Conformal Bond Connections
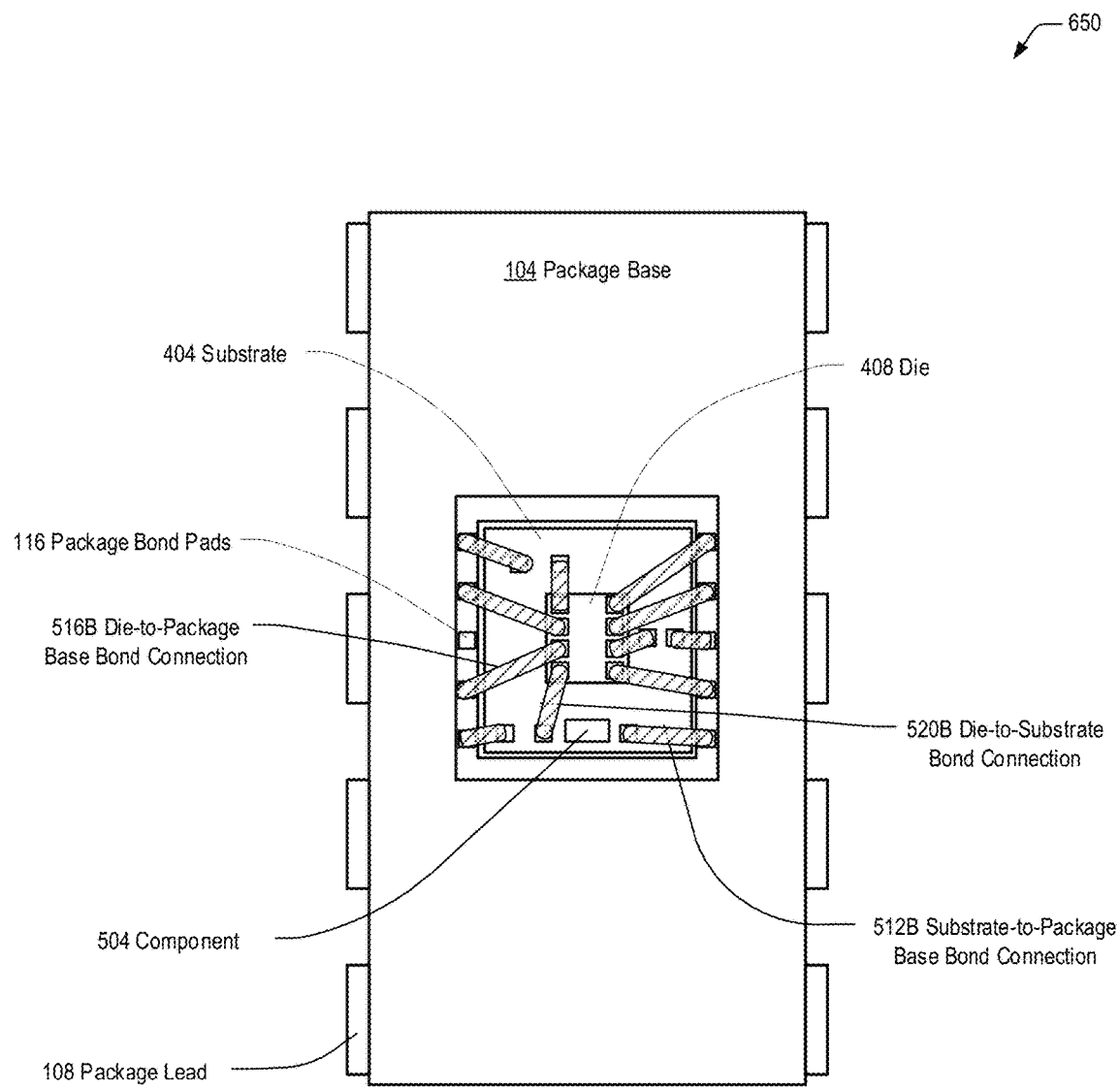

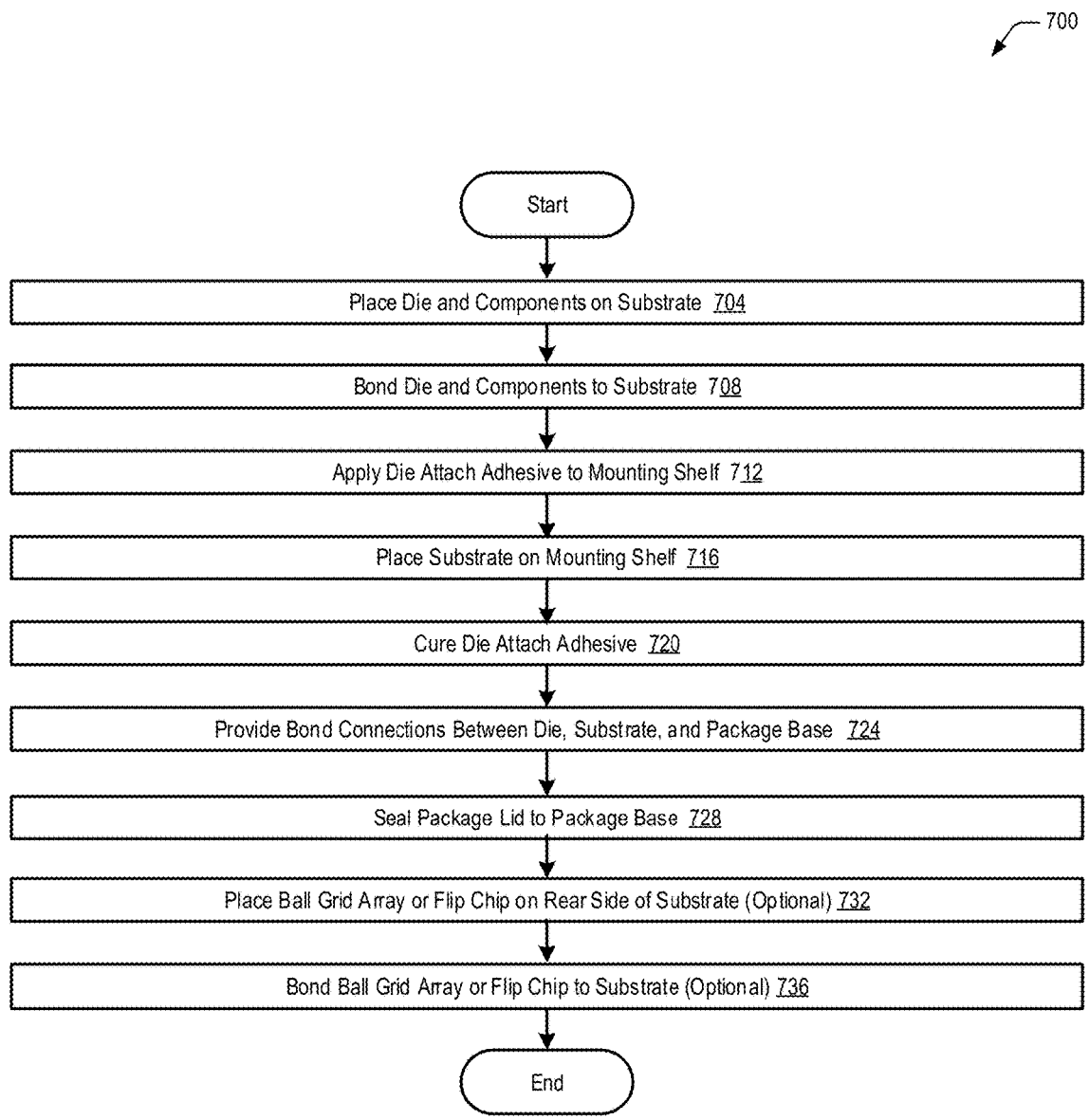
Fig. 7 Assembly Method for Integrated Circuit

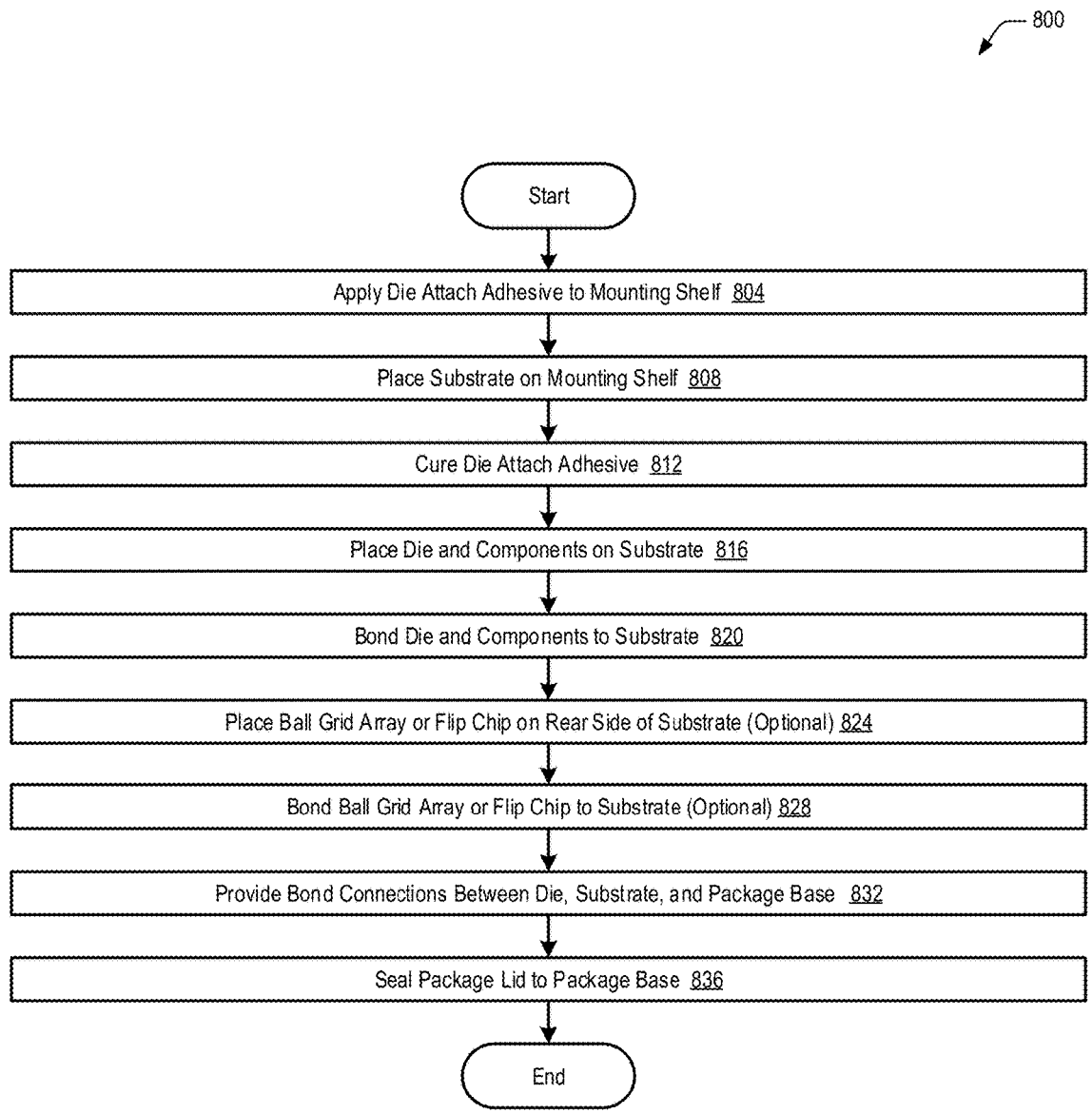
Fig. 8 Assembly Method for Integrated Circuit

Fig. 9 Assembly Method for Integrated Circuit
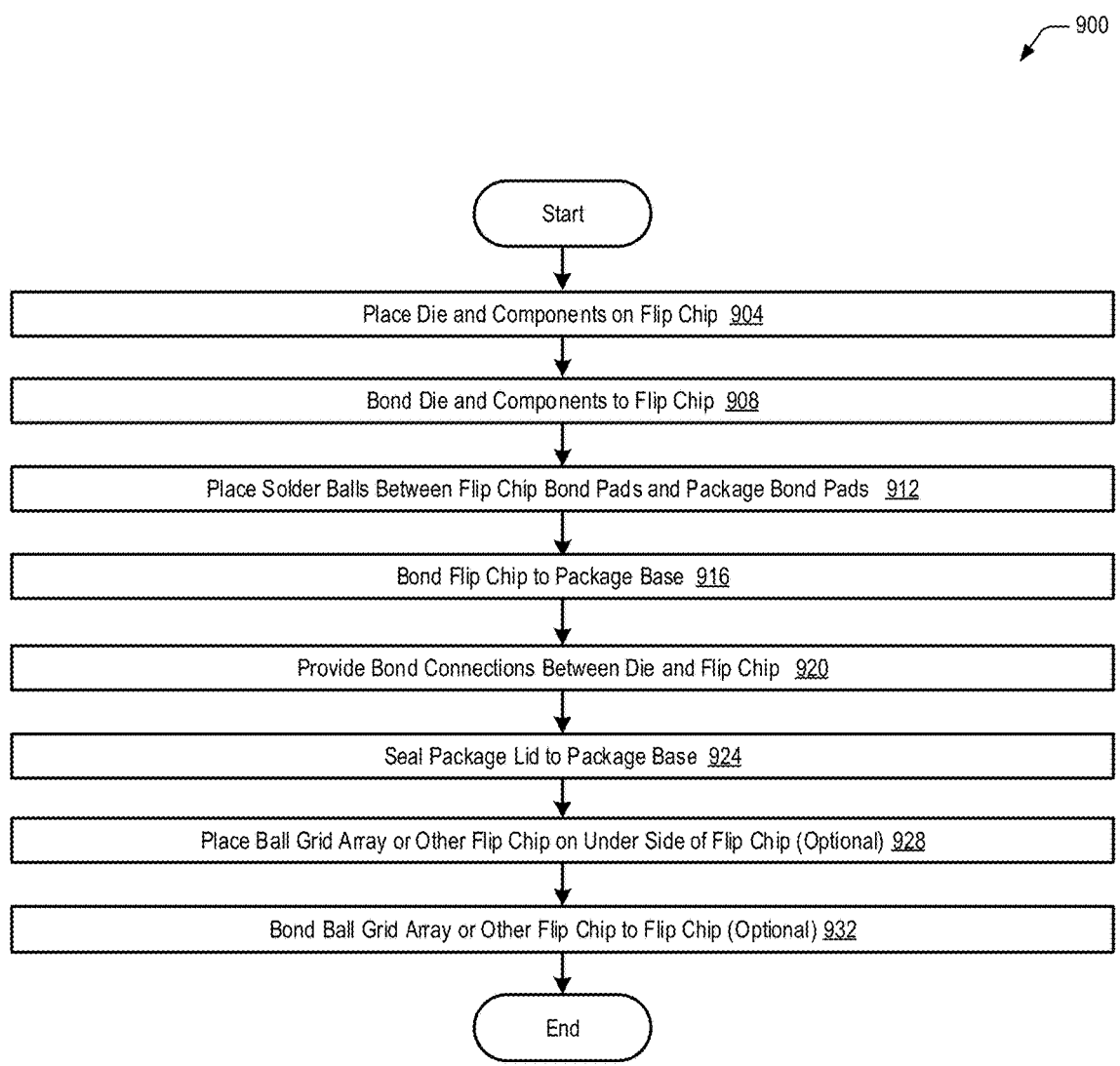

Fig. 10 Assembly Method for Integrated Circuit
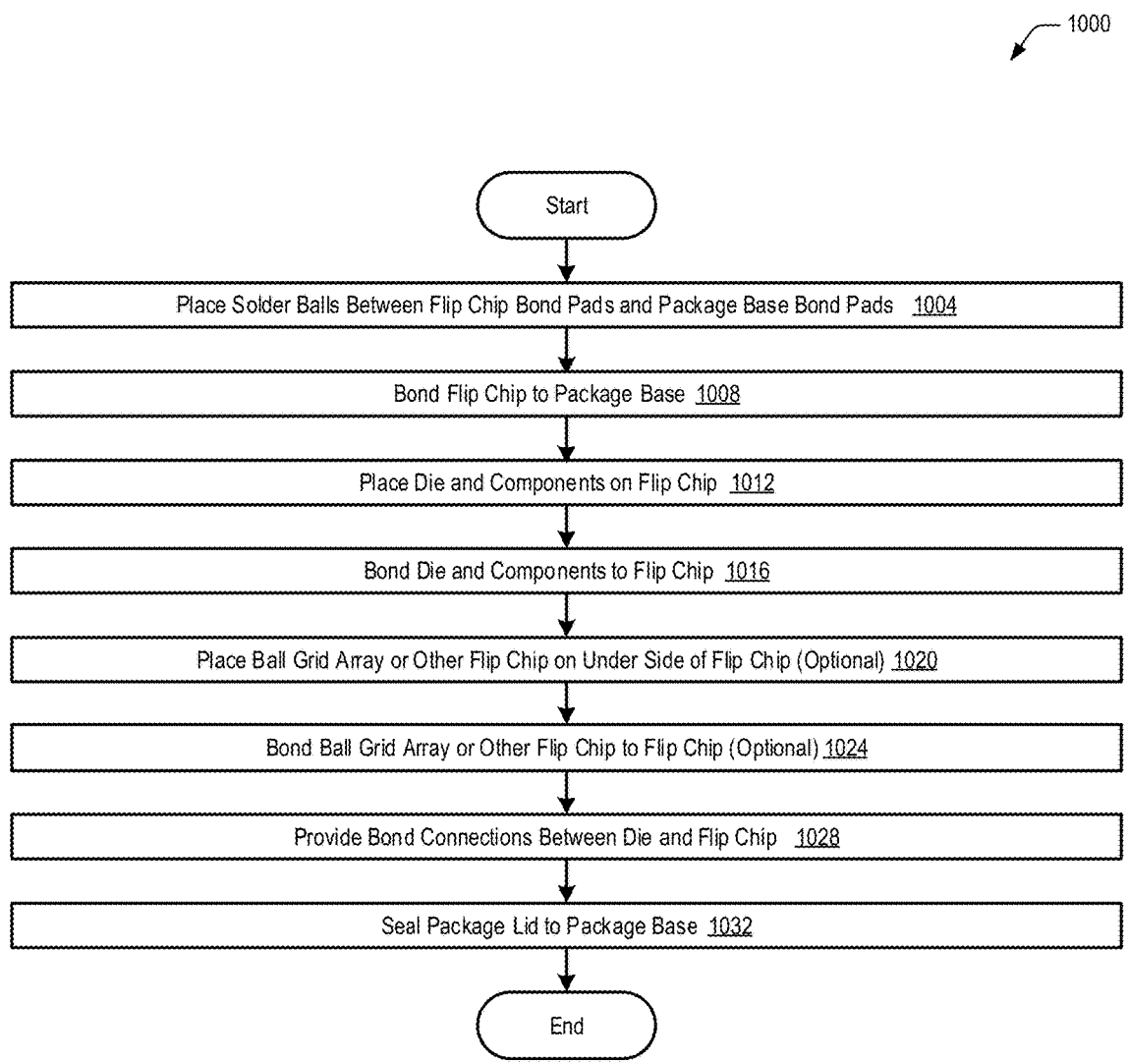

LOW PROFILE INTEGRATED CIRCUIT

FIELD

The present invention is directed to apparatuses and methods for low profile integrated circuits. In particular, the present invention is directed to semiconductor packaging that allows both front side and back side attachment to an internal substrate.

BACKGROUND

A semiconductor package is a metal, plastic, glass, or ceramic casing containing one or more discrete semiconductor devices or integrated circuits. Semiconductor dice are fabricated on semiconductor wafers (commonly silicon) before being diced into die, tested, and packaged. The package provides a means for connecting a die or dice to the external environment, such as a printed circuit board, via leads such as lands, balls, or pins; and protected against threats such as mechanical impact, chemical contamination, and light exposure. Additionally, the semiconductor package helps dissipate heat produced by the die, with or without the aid of a heat spreader. There are thousands of package types in current use. Some may be defined by international, national, or industry standards, while others are particular to an individual manufacturer. A semiconductor package may have as few as two leads or contacts for devices such as diodes, or in the case of advanced microprocessors, a package may have hundreds of connections. Very small packages may be supported only by their wire leads. Larger devices, intended for high-power applications, may be installed in carefully designed heat sinks so that they can dissipate hundreds or thousands of watts of heat.

Semiconductor packages may be molded out of an epoxy plastic that provides adequate protection of the semiconductor devices and mechanical strength to support the leads and handling of the package. Some devices, intended for high-reliability or aerospace or radiation environments, may use ceramic packages, with metal lids that are brazed on after assembly, or a glass frit seal. All-metal packages may be often used with high power (several watts or more) devices, since they conduct heat well and allow for easy assembly to a heat sink. Lead materials may bet be chosen with a thermal coefficient of expansion to match the package material.

Package materials for high-density dynamic memory may be selected for low background radiation; a single alpha particle emitted by package material may cause a single event upset and transient memory errors (soft errors). Spaceflight and military applications traditionally use hermetically packaged microcircuits. Many modern integrated circuits may only be available as plastic encapsulated microcircuits (PEMs). In addition to providing connections to the semiconductor and handling excess heat, the semiconductor package must protect the die and other components from the environment, particularly the ingress of moisture. Stray particles or corrosion products inside the package may degrade performance of the device or cause failure. A hermetic package allows essentially no gas exchange with the surroundings; such construction may require glass, ceramic, or metal enclosures.

SUMMARY

In accordance with an embodiment of the present invention, a device is provided. The device may include one or more of a package base, a substrate, a die secured to the substrate, a plurality of bond connections, and a package lid. The package base includes a plurality of package leads and a package base body. The package base body includes an open cavity disposed through the entire package base body, a plurality of package bond pads, disposed within a periphery of the open cavity, and a mounting shelf, disposed within the open cavity. The substrate is secured to the mounting shelf, and includes a plurality of substrate bond pads. The plurality of bond connections are configured to provide electrical connections between one or more of the die, the substrate bond pads, and the package bond pads. The package lid is secured over the open cavity to the package base body.

In accordance with another embodiment of the present invention, a method is provided. The method may include bonding a die to a front side of a substrate. In response to bonding the die to the substrate, the method may include one or more of bonding the substrate to a mounting shelf within a cavity of a package base, providing bond connections between one or more of the die, the substrate, and package bond pads of the package base, and sealing a lid over the cavity to a top surface of the package base. The front side of the substrate faces the lid, and the cavity extends through a height of the entire package base.

In accordance with yet another embodiment of the present invention, a method is provided. The method may include bonding a substrate to a mounting shelf within a cavity of a package base. In response to bonding the substrate to the mounting shelf, the the method may include one or more of bonding a die to a front side of the substrate, providing bond connections between one or more of the die, the substrate, and package bond pads of the package base, and sealing a lid over the cavity to a top surface of the package base. The front side of the substrate faces the lid, and the cavity extends through a height of the entire package base.

An advantage of the present invention is it provides both top side (i.e. internal) and bottom side (i.e. external) build-up within a low profile package. This provides very high density custom circuits within an existing package pinout, which may facilitate functional replication of an out-of-production integrated circuit.

Another advantage of the present invention is it can provide a hermetic environment for a complex custom circuit. A top side of a substrate may be packaged in a hermetic environment, where one or more dies and components are environmentally protected by a hermetic package base, hermetic package lid, hermetic lid seal, hermetic substrate, hermetic die attach adhesive, etc. A hermetic component, such as a ball grid array or flip-chip, may be bonded to an underside of the substrate and still maintain hermeticity for the entire device.

Another advantage of the present invention is it can provide a non-hermetic environment for a complex custom circuit. An inexpensive package base such as plastic may be used in conjunction with an inexpensive FR-4 printed circuit board as a substrate. In lieu of a package lid, an inexpensive encapsulant material may fill the open cavity and capture any bond wires used during the packaging process.

Yet another advantage of the present invention is it provides a flexible custom circuit for any type of thru hole or surface mount meta-package. DIP, PGA, SIP, QFP, etc packages are all supported. This allows an existing meta-package footprint on an existing assembly to be maintained without requiring redesign of an assembly using the meta-package.

Additional features and advantages of embodiments of the present invention will become more readily apparent from the following description, particularly when taken together with the accompanying drawings.

BRIEF DESCRIPTION OF THE DRAWINGS

FIG. 1A is a dual in-line package configuration, in accordance with a first embodiment of the present application.

FIG. 1B is a dual in-line package configuration, in accordance with a second embodiment of the present application.

FIG. 2A is a pin grid array package configuration, in accordance with the first embodiment of the present application.

FIG. 2B is a pin grid array package configuration, in accordance with the second embodiment of the present application.

FIG. 3A is a quad flat pack package configuration, in accordance with the first embodiment of the present application.

FIG. 3B is a quad flat pack package configuration, in accordance with the second embodiment of the present application.

FIG. 4A is a low-profile package configuration, in accordance with the first embodiment of the present application.

FIG. 4B is a low-profile package configuration, in accordance with the second embodiment of the present application.

FIG. 5A is substrate and die detail, in accordance with the first embodiment of the present application.

FIG. 5B is flip chip and die detail, in accordance with the second embodiment of the present application.

FIG. 6A is a diagram illustrating a substrate bonded to a package base with bond wires, in accordance with embodiments of the present application.

FIG. 6B is a diagram illustrating a substrate bonded to a package base with conformal bond connections, in accordance with embodiments of the present application.

FIG. 7 is a flowchart illustrating an assembly method for an integrated circuit, in accordance with embodiments of the present application.

FIG. 8 is a flowchart illustrating an assembly method for an integrated circuit, in accordance with embodiments of the present application.

FIG. 9 is a flowchart illustrating an assembly method for an integrated circuit, in accordance with embodiments of the present application.

FIG. 10 is a flowchart illustrating an assembly method for an integrated circuit, in accordance with embodiments of the present application.

DETAILED DESCRIPTION

Over time, semiconductor packaging has taken on many forms, some of which provide more compact height and footprints. Over time, newer and more compact packages have been developed in order to provide denser meta circuit layouts. However, because newer packaging may have a different land pattern, it may not be compatible with older packaging, and an assembly using the older packaging (such as a printed circuit board) may need to be redesigned to make use of the newer packaging. This may be undesirable due to costs or time required to design, test, qualify, and manufacture the new assembly. Therefore, what is needed is a way to use existing meta assemblies when a component of the meta assembly is no longer available. The present application describes a semiconductor packaging approach that solves this problem.

Referring now to FIG. 1A, a dual in-line package configuration 100, in accordance with a first embodiment of the present application is shown. The first embodiment includes a separate mounting shelf 120 from surfaces that include the package bond pads 116, for mounting a substrate 404. FIG. 1A illustrates an exemplary dual in-line (DIP) package base 104A, with four package leads 108 disposed on each side of a package base body 124A. The package leads 108 are coupled to a leadframe that distributes electrical connections to/from package bond pads 116. Although an 8-lead DIP package base 104A is shown, it should be understood that package base 104A may include any number of package leads 108.

In most embodiments, each package lead 108 is individually and independently electrically connected to one package bond pad 116. However, the present invention does not require this one-to-one correspondence between package leads 108 and package bond pads 116. For example, in one embodiment one or more package leads 108 may be electrically connected to no package bond pads 116. In another embodiment, one or more package leads 108 may be electrically connected to multiple package bond pads 116. In another embodiment, there may be fewer package leads 108 than package bond pads 116. In another embodiment, there may be more package leads 108 than package bond pads 116.

Dual in-line (DIP) package base 104A includes an open cavity 112 through the entire package base 104A. The open cavity 112 extends from a top surface of the package base body 124A to a bottom surface of the package base body 124A. The package bond pads 116 are disposed around a periphery of the open cavity 112, and may be horizontally positioned with respect to the package base body 124A to receive bond connections. The open cavity 112 also includes a mounting shelf 120 around the periphery of the open cavity 112. The mounting shelf 120 may allow the installation of a substrate 404 within the package base 104A, as will be further described herein. In one embodiment, the mounting shelf 120 may be located below the package bond pads 116 (as shown). In another embodiment, the mounting shelf 120 may be located above the package bond pads 116.

Referring now to FIG. 1B, a dual in-line package configuration 150, in accordance with a second embodiment of the present application is shown. The package base 104B of the second embodiment does not include a separate mounting shelf 120 from surfaces that include the package bond pads 116, for mounting a substrate 404 or flip chip 454. Instead. The mounting shelf 154 in the second embodiment includes the same surfaces that include the package bond pads 116. Otherwise, the package leads 108, package bond pads 116, and open cavity 112 are similar to the first embodiment.

Referring now to FIG. 2A, a pin grid array package configuration 200, in accordance with the first embodiment of the present application is shown. The first embodiment includes a separate mounting shelf 120 from surfaces that include the package bond pads 116, for mounting a substrate 404. FIG. 2A illustrates an exemplary pin grid array (PGA) package base 104C, with an array of package leads 108 projecting downward from the package base 104C. The package leads 108 are coupled to a leadframe that distributes electrical connections to/from package bond pads 116. It should be understood that package base 104C may include any number of package leads 108.

In most embodiments, each package lead 108 is individually and independently electrically connected to one package bond pad 116. However, the present invention does not require this one-to-one correspondence between package leads 108 and package bond pads 116. For example, in one embodiment one or more package leads 108 may be electrically connected to no package bond pads 116. In another embodiment, one or more package leads 108 may be electrically connected to multiple package bond pads 116. In another embodiment, there may be fewer package leads 108 than package bond pads 116. In another embodiment, there may be more package leads 108 than package bond pads 116.

Pin grid array package base 104C includes an open cavity 112 through the entire package base 104C. The open cavity 112 extends from a top surface of the package base 104C to a bottom surface of the package base 104C. The package bond pads 116 are disposed around a periphery of the open cavity 112, and may be horizontally positioned with respect to the package base 104C to receive bond connections. The open cavity 112 also includes a mounting shelf 120 around the periphery of the open cavity 112. The mounting shelf 120 may allow the installation of a substrate 404 within the package base 104C, as will be further described herein.

Referring now to FIG. 2B, a pin grid array package configuration 250, in accordance with the second embodiment of the present application is shown. The package base 104D of the second embodiment does not include a separate mounting shelf 120 from surfaces that include the package bond pads 116, for mounting a substrate 404 or flip chip 454. Instead. The mounting shelf 154 in the second embodiment includes the same surfaces that include the package bond pads 116. Otherwise, the package leads 108, package bond pads 116, and open cavity 112 are similar to the first embodiment.

Referring now to FIG. 3A, a quad flat pack package configuration 300, in accordance with the first embodiment of the present application is shown. The first embodiment includes a separate mounting shelf 120 from surfaces that include the package bond pads 116, for mounting a substrate 404. FIG. 3A illustrates an exemplary quad flat pack package base 104E, with an array of package leads 108 projecting outward from sides of the package base 104E. The package leads 108 are coupled to a leadframe that distributes electrical connections to/from package bond pads 116. It should be understood that package base 104E may include any number of package leads 108.

In most embodiments, each package lead 108 is individually and independently electrically connected to one package bond pad 116. However, the present invention does not require this one-to-one correspondence between package leads 108 and package bond pads 116. For example, in one embodiment one or more package leads 108 may be electrically connected to no package bond pads 116. In another embodiment, one or more package leads 108 may be electrically connected to multiple package bond pads 116. In another embodiment, there may be fewer package leads 108 than package bond pads 116. In another embodiment, there may be more package leads 108 than package bond pads 116.

Quad flat pack package base 104E includes an open cavity 112 through the entire package base 104E. The open cavity 112 extends from a top surface of the package base 104E to a bottom surface of the package base 104E. The package bond pads 116 are disposed around a periphery of the open cavity 112, and may be horizontally positioned with respect to the package base 104E to receive bond connections. The open cavity 112 also includes a mounting shelf 120 around the periphery of the open cavity 112. The mounting shelf 120 may allow the installation of a substrate 404 within the package base 104E, as will be further described herein.

Referring now to FIG. 3B, a quad flat pack package configuration 350, in accordance with the second embodiment of the present application is shown. The package base 104F of the second embodiment does not include a separate mounting shelf 120 from surfaces that include the package bond pads 116, for mounting a substrate 404 or flip chip 454. Instead. The mounting shelf 154 in the second embodiment includes the same surfaces that include the package bond pads 116. Otherwise, the package leads 108, package bond pads 116, and open cavity 112 are similar to the first embodiment.

Referring now to FIG. 4A, a low-profile package configuration 400, in accordance with the first embodiment of the present application is shown. FIG. 4A illustrates a side view of a dual in-line package (DIP), although it should be understood that the mounting shown may be applied to any package type. The low-profile package 400 includes a separate mounting shelf 120 from the surface or shelf the package bond pads 116 are mounted to. A substrate 404 is mounted to the mounting shelf 120 using an appropriate die attach adhesive 432 known in the art. The package base 104 includes an open cavity 112, extending through a height of the package base 104 as shown. In one embodiment, the substrate 404 overlaps all four sides of the mounting shelf 120 such that when the substrate 404 is secured to the mounting shelf 120, no gaps are present to the open cavity 112 from a bottom of the package base 104.

The substrate 404 may be a ceramic, glass, or metal substrate, or a glass-epoxy printed circuit board such as an FR-4 circuit board. Substrate 404 includes substrate bond pads 428, conductive traces, and two or more layers therein. The substrate 404 may be of rectangular shape, including square. One or more semiconductor dies (dice) 408 are secured to a top surface of the substrate 404. Each die 408 may be attached to the substrate 404 using die attach adhesive 432 and/or bonded using solder balls. In some embodiments, a ball grid array (BGA) or flip chip 412 may be attached to a bottom surface of the substrate 404 using solder balls.

In one embodiment, a package lid 416 may be secured to a top surface of the package base 104 using a lid seal compound 420. In another embodiment, in lieu of a package lid 416 and lid seal 420, the cavity 112 may be filled with a suitable encapsulant (not shown), which may have the advantage of securing bond wires 424 within the cavity 112.

The substrate 404 may include any number of substrate bond pads 428, each of which may receive a bond connection as shown in FIG. 5A. FIG. 4A shows two bond connections 424, each shown as a bond wire between a substrate bond pad 428 and a package bond pad 116.

The low-profile package 400 may be either hermetic or non-hermetic. For hermetic applications, the package base 104 and package lid 416 may be constructed from hermetic materials such as metal and/or ceramic. A hermetic die attach adhesive 432 and hermetic lid seal 420 (such as a hermetic sealing glass or solder compound) are also required. In some embodiments, the open cavity 112 may be filled with an inert gas such as argon and evacuated compared to an exterior environment outside the low-profile package 400.

Referring now to FIG. 4B, a low-profile package configuration 450, in accordance with the second embodiment of the present application is shown. FIG. 4B illustrates a side view of a dual in-line package (DIP), although it should be understood that the mounting shown may be applied to any package type. The low-profile package 450 includes a common mounting shelf 154 to the surface or shelf the package bond pads 116 are mounted to. A flip chip 454 may be mounted to the mounting shelf 154 through flip chip bond pads 458 bonded to package bond pads 116, using thermosonic bonding, wedge bonding, or other processes known in the art. The package base 104 includes an open cavity 112, extending through a height of the package base 104 as shown.

In some embodiments, a die 408 and/or components 504 may be mounted to a top side of the flip chip 454 and/or a ball grid array or other flip chip 412 may be bonded to a bottom side of the flip chip 454.

In one embodiment, a package lid 416 may be secured to a top surface of the package base 104 using a lid seal compound 420. In another embodiment, in lieu of a package lid 416 and lid seal 420, the cavity 112 may be filled with a suitable encapsulant compound (not shown).

The flip chip 454 may include any number of flip chip bond pads 458, each of which may have a separate bond connection 424 to package bond pads 116. However, not every flip chip bond pad 458 or package bond pad 116 may have a bond connection 424.

The low-profile package 450 may be either hermetic or non-hermetic. For hermetic applications, the package base 104 and package lid 416 may be constructed from hermetic materials such as metal and/or ceramic. A hermetic die attach adhesive 432 and hermetic lid seal 420 (such as a hermetic solder compound) may also be required. In some embodiments, the open cavity 112 may be filled with an inert gas such as argon and evacuated compared to an exterior environment outside the low-profile package 450.

Referring now to FIG. 5A, substrate and die detail 500, in accordance with the first embodiment of the present application is shown. FIG. 5A illustrates various elements that may be present with a substrate 404, separated from the package base 104 and package lid 416 for clarity. The substrate 404 may have substrate bond pads on one surface of the substrate 404, and BGA or flip chip bond pads 508 on an opposite side of the substrate 404. The substrate bond pads are intended to provide bond connections elsewhere and may be routed within/on the substrate 404 between other substrate bond pads, BGA or flip chip bond pads 508, and components 504.

The substrate 404 may have any number of components 504 bonded to it. Components 504 may be discrete components such as resistors, capacitors, or inductors, or more complex components including but not limited to voltage regulators, op amps, or analog/linear circuits. Two exemplary components 504 are shown in FIG. 5A, identified as components 504A and 504B. Any number of components 504 may be present, including no components 504. FIG. 5A illustrates components 504 directly bonded to the substrate 404, presumably through component bond pads (not shown) directly bonded to package bond pads 116 (not shown) through solder balls. However, alternately some or all component bond pads may be conductively coupled though the substrate 404 to substrate bond pads, which may then be bonded elsewhere as described below.

One or more semiconductor dice 408 may be present, typically secured to the substrate 404 with a suitable die attach adhesive 432. Each die 408 is typically mounted such that a die surface with no die bond pads is mounted to the substrate 404, and an opposite die surface with die bond pads faces away from the substrate 404. One or more ball grid arrays (BGA) or flip chips 412 may be bonded to BGA or flip chip bond pads 508 with solder balls.

A die or dice 408 may be bonded to package bond pads 116 through die-to-package base bond connections 516. A die 408 may also or alternately be bonded to substrate bond pads 428 through die-to-substrate bond connections 520. The substrate 404 itself, or component 504 connections on the substrate 404, as described above, may be bonded to package bond pads 116 through substrate-to-package base bond connections 512. Bond connections 512, 516, 520 may be any combination of bond wires or conformal bond connections as described herein.

Referring now to FIG. 5B, flip chip and die detail 550, in accordance with the second embodiment of the present application is shown. FIG. 5B illustrates various elements that may be present with a flip chip 454, separated from the package base 104 and package lid 416 for clarity. The flip chip 454 may have flip chip bond pads 458 on a rear surface of the flip chip 454, and/or BGA bond pads 508 as well. The flip chip bond pads 458 are intended to provide bond connections to package bond connections 116 through solder ball connections.

The flip chip 454 may have any number of components 504 bonded to it. Components 504 may be discrete components such as resistors, capacitors, or inductors, or more complex components including but not limited to voltage regulators, op amps, or analog/linear circuits. Two exemplary components 504 are shown in FIG. 5B, identified as components 504A and 504B. Any number of components 504 may be present, including no components 504. FIG. 5B illustrates components 504 directly bonded to the flip chip 454, presumably through component bond pads (not shown).

One or more semiconductor dice 408 may also be present, typically secured to the flip chip 454 with a suitable die attach adhesive 432. Each die 408 is typically mounted such that a die surface with no die bond pads is mounted to the flip chip 454, and an opposite die surface with die bond pads faces away from the flip chip 454. One or more ball grid arrays (BGA) or other flip chips 412 may be bonded to BGA or flip chip bond pads 508 with solder balls.

A die 408 may be bonded to package bond pads 116 through die-to-package base bond connections 516. A die 408 may also or alternately be bonded to flip chip bond pads 458 through die-to-flip chip bond connections 558. The flip chip 454 itself, or component 504 connections on the flip chip 454, as described above, may be bonded to package bond pads 116 through flip chip-to-package base bond connections 554. Bond connections 554, 516, 558 may be any combination of bond wires or conformal bond connections as described herein.

Referring now to FIG. 6A, a diagram illustrating a substrate bonded to a package base with bond wires 600, in accordance with embodiments of the present application is shown. FIG. 6A shows a top view of an exemplary dual in-line package base 104 just prior to bonding a package lid 416 to the package base 104.

A substrate 404 has been previous bonded to a mounting shelf 120 within an open cavity 112 of the package base 104, using a suitable die attach adhesive 432. A die 408 having eight die bond pads is mounted inverted to the substrate 404, with the die bond pads exposed for wire bonding. The substrate 404 may include various components 504 (one component 504 shown), and substrate bond pads 428 (seven substrate bond pads 428 shown). The package base 104 is shown with ten package leads 108 and ten package bond pads 116, which are typically electrically connected through a leadframe (not shown).

Five die bond pads are electrically connected to package bond pads 116 through individual bond wires as die-to-package base bond connections 516A. Three die bond pads are electrically connected to substrate bond pads through individual bond wires as die-to-substrate bond connections 520A. Finally, four substrate bond pads are electrically connected to package bond pads 116 through individual bond wires as substrate-to-package base bond connections 512A. One package bond pad is a no-connect, and therefore does not have a bond wire attached.

Referring now to FIG. 6B, a diagram illustrating a substrate bonded to a package base with conformal bond connections 650, in accordance with embodiments of the present application is shown. FIG. 6B shows a top view of an exemplary dual in-line package base 104 just prior to bonding a package lid 416 to the package base 104.

In order to provide clarity, FIG. 6B illustrates a similar package base 104, die 408, and component 504, as FIG. 6A. The number of package leads 108, package bond pads 116, die bond pads, and substrate bond pads is the same as shown in FIG. 6A. However, in lieu of conventional bond wires, conformal bond connections 512B, 516B, 520B are shown.

Five die bond pads are electrically connected to package bond pads 116 through conformal bond connections as die-to-package base bond connections 516B. Three die bond pads are electrically connected to substrate bond pads through conformal bond connections as die-to-substrate bond connections 520B. Finally, four substrate bond pads are electrically connected to package bond pads 116 through conformal bond connections as substrate-to-package base bond connections 512B. One package bond pad is a no-connect, and therefore does not have a bond connection attached.

Conformal bond connections 512B, 516B, 520B lie along surfaces of the substrate 404, die 408, and package base 104. In one embodiment, conformal bond connections 512B, 516B, 520B may be provided by a redistribution layer (RDL). In another embodiment, conformal bond connections 512B, 516B, 520B may be provided by a 3D printing process and successively built up over application of a number of layers. In one embodiment, conformal bond connections 512B, 516B, 520B may be provided by a conductive conformal bond connections 512B, 516B, 520B only. This may be suitable if the portions of the die 408, substrate 404, and package base 104 over which the conductive conformal bond connections 512B, 516B, 520B are provided are non-conducting surfaces such as non-conductive plastics or ceramics. However, in other embodiments the conformal bond connections 512B, 516B, 520B may be provided over conductive traces such as conductive traces of the substrate 404 or over conductive surfaces of either the substrate 404, die 408, or package base 104 such as a metal package base 104. In this case, conformal bond connections 512B, 516B, 520B may include a conductive portion applied over a non-conductive or insulating portion. These approaches are fully described in commonly owned application Ser. No. 15/792,381, now U.S. Pat. No. 10,147,660.

Referring now to FIG. 7, a flowchart illustrating an assembly method for an integrated circuit 700, in accordance with embodiments of the present application is shown. The process of FIG. 7 builds up a substrate 404 prior to mounting the substrate 404 in a package base 104 and providing bond connections 424. However, an optional ball grid array or flip chip 412 may be optionally assembled to a rear side of the substrate 404 following initial assembly. Flow begins at block 704.

At block 704, a die 408 and components 504 are placed on a substrate 404. Any number of dice 408 or components 504 may be included in this step. Flow proceeds to block 708.

At block 708, the die 408 and components 504 are bonded to the substrate 404. A die attach adhesive 432 may be used to bond the die 408 to the substrate 404. Alternately, solder balls between die bond pads and substrate bond pads may be exposed to a reflow process in order to provide the bonds. Flow proceeds to block 712.

At block 712, a die attach adhesive 432 is applied to a mounting shelf 120 within a package base 104. In one embodiment, the die attach adhesive 432 is a hermetic die attach adhesive 432. Flow proceeds to block 716.

At block 716, the substrate 404 is placed on the mounting shelf 120. At this point, the substrate 404 has been pre-assembled with one or more dice 408 and components 504. Flow proceeds to block 720.

At block 720, the die attach adhesive 432 is cured. In one embodiment, the die attach adhesive 432 is cured at a higher temperature than room temperature, and a baking oven performs the curing at the higher temperature. Flow proceeds to block 724.

At block 724, bond connections 424 are provided between the die 408, substrate 404, and the package base 104. Bond connections 424 may be either bond wires or conformal bond connections, as described herein. Flow proceeds to block 728.

At block 728, a package lid 416 is sealed to the package base 104. In one embodiment, the package base 104 and package lid 416 are non-hermetic. In another embodiment, the package base 104 and package lid 416 are hermetic. In another embodiment, a lid seal material 420 seals the package lid 416 to the package base 104. In another embodiment, the integrated circuit includes an open cavity and an inert gas is injected into the open cavity 112 during the lid seal operation. In another embodiment, the open cavity 112 is pressurized to one of a lower pressure and a higher pressure compared to an atmospheric pressure outside the integrated circuit. Flow ends at block 728 or proceeds to optional block 732.

At optional block 732, a ball grid array (BGA) or flip chip 412 is placed on the rear side of the substrate 404. The rear side faces downward, relative to the package base 104. Flow proceeds to optional block 736.

At optional block 736, the ball grid array or flip chip 412 is bonded to the substrate 404. In one embodiment, solder balls are placed on BGA or flip chip bond pads 508 prior to placing the ball grid array or flip chip 412, and a conventional reflow process bonds the ball grid array or flip chip 412 to the substrate 404. Flow ends at optional block 736.

Referring now to FIG. 8, a flowchart illustrating an assembly method for an integrated circuit 800, in accordance with embodiments of the present application is shown. The process of FIG. 8 mounts a bare substrate 404 into a package base 104 prior to building up the substrate 404 in the package base 104 and providing bond connections 424. An optional ball grid array or flip chip 412 may be optionally assembled to a rear side of the substrate 404 following substrate 404 mounting. Flow begins at block 804.

At block 804, a die attach adhesive 432 is applied to a mounting shelf 120 within a package base 104. In one embodiment, the die attach adhesive 432 is a hermetic die attach adhesive 432. Flow proceeds to block 808.

At block 808, the substrate 404 is placed on the mounting shelf 120. At this point, the substrate 404 has been secured to the package base 104. Flow proceeds to block 812.

At block 812, the die attach adhesive 432 is cured. In one embodiment, the die attach adhesive 432 is cured at a higher temperature than room temperature, and a baking over performs the curing at the higher temperature. Flow proceeds to block 816.

At block 816, a die 408 and components 504 are placed on the substrate 404. Any number of dice 408 or components 504 may be included in this step. Flow proceeds to block 820.

At block 820, the die 408 and components 504 are bonded to the substrate 404. A die attach adhesive 432 may be used to bond the die 408 to the substrate 404. Alternately, solder balls between die bond pads and substrate bond pads may be exposed to a reflow process in order to provide the bonds. Flow proceeds to block 832 or optional block 824.

At optional block 824, a ball grid array (BGA) or flip chip 412 is placed on the rear side of the substrate 404. The rear side faces downward, relative to the package base 104. Flow proceeds to optional block 828.

At optional block 828, the ball grid array or flip chip 412 is bonded to the substrate 404. In one embodiment, solder balls are placed on BGA or flip chip bond pads 508 prior to placing the ball grid array or flip chip 412, and a conventional reflow process bonds the ball grid array or flip chip 412 to the substrate 404. Flow proceeds to block 832.

At block 832, bond connections 424 are provided between the die 408, substrate 404, and the package base 104. Bond connections 424 may be either bond wires or conformal bond connections, as described herein. Flow proceeds to block 836.

At block 836, a package lid 416 is sealed to the package base 104. In one embodiment, the package base 104 and package lid 416 are non-hermetic. In another embodiment, the package base 104 and package lid 416 are hermetic. In another embodiment, a lid seal material 420 seals the package lid 416 to the package base 104. In another embodiment, the integrated circuit includes an open cavity 112 and an inert gas is injected into the open cavity 112 during the lid seal operation. In another embodiment, the open cavity 112 is pressurized to one of a lower pressure and a higher pressure compared to an atmospheric pressure outside the integrated circuit. Flow ends at block 836.

Referring now to FIG. 9, a flowchart illustrating an assembly method for an integrated circuit 900, in accordance with embodiments of the present application is shown. The process of FIG. 9 builds up a flip chip 454 prior to mounting the flip chip 454 in a package base 104 and providing bond connections 424. However, an optional ball grid array or flip chip 412 may be optionally assembled to a rear side of the flip chip 454 following initial assembly. Flow begins at block 904.

At block 904, a die 408 and components 504 are placed on a flip chip 454. Any number of dice 408 or components 504 may be included in this step. Flow proceeds to block 908.

At block 908, the die 408 and components 504 are bonded to the flip chip 454. A die attach adhesive 432 may be used to bond the die 408 to the flip chip 454. Alternately, solder balls between die bond pads and flip chip bond pads 458 may be exposed to a reflow process in order to provide the bonds. Flow proceeds to block 912.

At block 912, solder balls are placed between flip chip bond pads 458 and package bond pads 116 (i.e. the flip chip 454 is placed on the package bond pads 116). Flow proceeds to block 916.

At block 916, the flip chip 454 is bonded to the package base 104. A conventional thermal reflow process may be used to melt the solder balls to the flip chip bond pads 458 and package bond pads 116. Flow proceeds to block 920.

At block 920, bond connections 424 are provided between the die 408 and the flip chip 454 (i.e. the flip chip 454 has already been bonded to the package base 104 through package bond pads 116). Bond connections 424 may be either bond wires (512A, 516A, 520A) or conformal bond connections (512B, 516B, 520B), as described herein. Flow proceeds to block 924.

At block 924, a package lid 416 is sealed to the package base 104. In one embodiment, the package base 104 and package lid 416 are non-hermetic. In another embodiment, the package base 104 and package lid 416 are hermetic. In another embodiment, a lid seal material 420 seals the package lid 416 to the package base 104. In another embodiment, the integrated circuit includes an open cavity 112 and an inert gas is injected into the open cavity 112 during the lid seal operation. In another embodiment, the open cavity 112 is pressurized to one of a lower pressure and a higher pressure compared to an atmospheric pressure outside the integrated circuit. Flow ends at block 924 or proceeds to optional block 928.

At optional block 928, a ball grid array (BGA) or other flip chip 412 is placed on the rear side of the flip chip 454. The rear side faces downward, relative to the package base 104. Flow proceeds to optional block 932.

At optional block 932, the ball grid array or other flip chip 412 is bonded to the flip chip 454. In one embodiment, solder balls are placed on BGA or flip chip bond pads 508 prior to placing the ball grid array or flip chip 412, and a conventional reflow process bonds the ball grid array or other flip chip 412 to the flip chip 454. Flow ends at optional block 932.

Referring now to FIG. 10, a flowchart illustrating an assembly method for an integrated circuit 1000, in accordance with embodiments of the present application is shown. The process of FIG. 10 mounts a flip chip 454 into a package base 104 prior to building up the flip chip 454 in the package base 104 and providing bond connections 424. An optional ball grid array or other flip chip 412 may be optionally assembled to a rear side of the flip chip 454 following flip chip 454 mounting. Flow begins at block 1004.

At block 1004, solder balls are placed between flip chip bond pads 458 and package bond pads 116 (i.e. the flip chip 454 is placed on the package bond pads 116). Flow proceeds to block 1008.

At block 1008, the flip chip 454 is bonded to the package base 104. A conventional thermal reflow process may be used to melt the solder balls to the flip chip bond pads 458 and package bond pads 116. Flow proceeds to block 1012.

At block 1012, a die 408 and components 504 are placed on a flip chip 454. Any number of dice 408 or components 504 may be included in this step. Flow proceeds to block 1016.

At block 1016, the die 408 and components 504 are bonded to the flip chip 454. A die attach adhesive 432 may be used to bond the die 408 to the flip chip 454. Alternately, solder balls between die bond pads and flip chip bond pads 458 may be exposed to a reflow process in order to provide the bonds. Flow proceeds to block 1028 or optional block 1020.

At optional block 1020, a ball grid array (BGA) or other flip chip 412 is placed on the rear side of the flip chip 454. The rear side faces downward, relative to the package base 104. Flow proceeds to optional block 1024.

At optional block 1024, the ball grid array or other flip chip 412 is bonded to the flip chip 454. In one embodiment, solder balls are placed on BGA or other flip chip bond pads 508 prior to placing the ball grid array or other flip chip 412, and a conventional reflow process bonds the ball grid array or other flip chip 412 to the flip chip 454. Flow proceeds to block 1028.

At block 1028, bond connections 424 are provided between the die 408 and the flip chip 454 (i.e. the flip chip 454 has already been bonded to the package base 104 through package bond pads 116). Bond connections 424 may be either bond wires (512A, 516A, 520A) or conformal bond connections (512B, 516B, 520B), as described herein. Flow proceeds to block 1032.

At block 1032, a package lid 416 is sealed to the package base 104. In one embodiment, the package base 104 and package lid 416 are non-hermetic. In another embodiment, the package base 104 and package lid 416 are hermetic. In another embodiment, a lid seal material 420 seals the package lid 416 to the package base 104. In another embodiment, the integrated circuit includes an open cavity 112 and an inert gas is injected into the open cavity 112 during the lid seal operation. In another embodiment, the open cavity 112 is pressurized to one of a lower pressure and a higher pressure compared to an atmospheric pressure outside the integrated circuit. Flow ends at block 1032.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

I claim:

1. A device, comprising:
    a package base comprising;
        a plurality of package leads; and
        a package base body, comprising:
            an open cavity, disposed through the entire package base body;
            a plurality of package bond pads, disposed within a periphery of the open cavity; and
            a mounting shelf, disposed within the open cavity;
    a substrate, secured to the mounting shelf, comprising a plurality of substrate bond pads and one or more of a linear device, a resistor, a capacitor, and an inductor;
    a die, secured to the substrate;
    a plurality of bond connections, configured to provide electrical connections between one or more of the die, the substrate bond pads, and the package bond pads; and
    a package lid, secured over the open cavity to the package base body.

2. The device of claim 1, wherein each of the plurality of package bond pads is electrically coupled to one or more of the plurality of package leads.

3. The device of claim 1, wherein the substrate comprises one of a printed circuit board and a ceramic plane of rectangular disposition, wherein the substrate comprises one or more routed electrical connections between substrate bond pads.

4. The device of claim 1, wherein the package base body and the package lid comprises one or more of ceramic, glass, and metal hermetic materials, wherein the substrate comprises a ceramic plane of rectangular disposition, wherein a hermetic die attach compound secures the substrate to the mounting shelf, wherein a hermetic lid seal compound secures the package lid to the package base body.

5. The device of claim 1, wherein the die is secured to a surface of the substrate facing the package lid, wherein the substrate comprises substrate bond pads on an opposite side as the package lid, wherein the substrate bond pads on the opposite side as the package lid are configured to directly couple to one of a ball grid array and a flip chip.

6. The device of claim 1, wherein the mounting shelf comprises the plurality of package bond pads, wherein the substrate comprises a flip chip that comprises flip chip bond pads oriented with and bonded to the plurality of package bond pads.

7. The device of claim 1, wherein one or more bond connections comprises conformal conductive traces in direct contact with one or more areas of the die, the substrate, and the package base between one or more of the package bond pads, the substrate bond pads, and bond pads of the die.

8. A method, comprising:
    bonding a die to a front side of a substrate;
    bonding one of a ball grid array and a flip chip to a rear side of the substrate;
    in response to bonding the die and one of the ball grid array and the flip chip to the substrate, bonding the substrate to a mounting shelf within a cavity of a package base, the cavity extending through a height of the entire package base;
    providing bond connections between one or more of the die, the substrate, and package bond pads of the package base; and
    sealing a lid over the cavity to a top surface of the package base, the front side of the substrate facing the lid.

9. The method of claim 8, wherein the substrate comprises one of a printed circuit board and a rectangular ceramic plane, wherein the substrate comprises one or more routed electrical connections between substrate bond pads.

10. The method of claim 8, wherein the package base and the package lid comprises one or more of ceramic, glass, and metal hermetic materials, wherein the substrate comprises a planar ceramic structure, wherein a hermetic die attach compound secures the substrate to the mounting shelf, wherein a hermetic lid seal compound secures the package lid to the package base.

11. The method of claim 8, wherein the mounting shelf comprises the package bond pads, wherein the substrate comprises a flip chip that comprises flip chip bond pads oriented with and bonded to the package bond pads.

12. The method of claim 8, wherein one or more bond connections comprises conformal conductive traces in contact with one or more areas of the die, the substrate, and the package base between one or more of the package bond pads, substrate bond pads, and bond pads of the die.

13. A method, comprising:
    bonding a substrate to a mounting shelf within a cavity of a package base, the cavity extending through a height of the entire package base;
    in response to bonding the substrate to the mounting shelf, bonding a die to a front side of the substrate and one of a ball grid array and a flip chip to a rear side of the substrate;
    providing bond connections between one or more of the die, the substrate, and package bond pads of the package base; and
    sealing a lid over the cavity to a top surface of the package base, the front side of the substrate facing the lid.

14. The method of claim 13, wherein the substrate comprises one of a printed circuit board and a rectangular ceramic plane, wherein the substrate comprises one or more routed electrical connections between substrate bond pads.

15. The method of claim 13, wherein the package base and the package lid comprises one or more of ceramic, glass, and metal hermetic materials, wherein the substrate comprises a rectangular ceramic plane, wherein a hermetic die attach compound secures the substrate to the mounting shelf, wherein a hermetic lid seal compound secures the package lid to the package base.

16. The method of claim 13, wherein the mounting shelf comprises the package bond pads, wherein the substrate comprises a flip chip that comprises flip chip bond pads oriented with and bonded to the package bond pads.

17. The method of claim 13, wherein one or more bond connections comprises conformal conductive traces in contact with one or more areas of the die, the substrate, and the package base between one or more of the package bond pads, substrate bond pads, and bond pads of the die.

* * * * *